(12) United States Patent
Martin et al.

(10) Patent No.: US 8,389,314 B2
(45) Date of Patent: Mar. 5, 2013

(54) MEMS DEVICE WITH ROUGHENED SURFACE AND METHOD OF PRODUCING THE SAME

(75) Inventors: John R. Martin, Foxborough, MA (US); Thomas D. Chen, Cambridge, MA (US); Jinbo Kuang, Acton, MA (US); Thomas Kieran Nunan, Carlisle, MA (US); Xin Zhang, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 810 days.

(21) Appl. No.: 11/538,281

(22) Filed: Oct. 3, 2006

(65) Prior Publication Data

US 2008/0081391 A1    Apr. 3, 2008

(51) Int. Cl.
 *H01L 21/00* (2006.01)
(52) U.S. Cl. .......... 438/48; 438/691; 257/414; 257/415; 257/E21.499; 257/E31.117
(58) Field of Classification Search ............... 438/48, 438/691; 257/414–415, E21.499, E31.117
See application file for complete search history.

(56) References Cited

U.S. PATENT DOCUMENTS

| | | | |
|---|---|---|---|
| 5,510,156 A | 4/1996 | Zhao | 427/534 |
| 5,679,436 A | 10/1997 | Zhao | 428/141 |
| 5,939,633 A | 8/1999 | Judy | 73/514.32 |
| 6,505,511 B1 | 1/2003 | Geen et al. | 73/504.12 |
| 6,859,577 B2 * | 2/2005 | Lin | 385/18 |
| 2006/0008098 A1 * | 1/2006 | Tu | 381/175 |
| 2006/0228823 A1 * | 10/2006 | Xu et al. | 438/50 |
| 2006/0289386 A1 * | 12/2006 | Tysoe et al. | 216/83 |

OTHER PUBLICATIONS

E. Bhattacharya et al., "*Effect of porous silicon formation on stiction in surface micromachined MEMS structures,*" Phys. Stat. Sol. (a) 202, No. 8/www.pss-a.com, pp. 1482-1486, 2005.

F. Delrio et al., "*The role of van der Waals forces in adhesion of micromachined surfaces,*" Nature Materials, vol. 4, pp. 629-634, Jul. 2005.

* cited by examiner

*Primary Examiner* — Eugene Lee
*Assistant Examiner* — Elias M Ullah
(74) *Attorney, Agent, or Firm* — Sunstein Kann Murphy & Timbers LLP (57) ABSTRACT

A method of producing a MEMS device provides a MEMS apparatus having released structure. The MEMS apparatus is formed at least in part from an SOI wafer having a first layer, a second layer spaced from the first layer, and an insulator layer between the first layer and second layer. The first layer has a top surface, while the second layer has a bottom surface facing the top surface. After providing the MEMS apparatus, the method increases the roughness of at least the top surface of the first layer or the bottom surface of the second layer.

12 Claims, 7 Drawing Sheets

MEMS DEVICE WITH ROUGHENED SURFACE AND METHOD OF PRODUCING THE SAME

FIELD OF THE INVENTION

The invention generally relates to MEMS devices and, more particularly, the invention relates to minimizing stiction in MEMS devices.

BACKGROUND OF THE INVENTION

Microelectromechanical systems ("MEMS") are used in a growing number of applications. For example, MEMS currently are implemented as gyroscopes to detect pitch angles of airplanes, and as accelerometers to selectively deploy air bags in automobiles. In simplified terms, such MEMS devices typically have a structure suspended above a substrate, and associated electronics that both senses movement of the suspended structure and delivers the sensed movement data to one or more external devices (e.g., an external computer). The external device processes the sensed data to calculate the property being measured (e.g., pitch angle or acceleration).

The suspended structures may have very smooth outer surfaces. Consequently, if the surface of a suspended structure contacts an adjacent component, the structure and component may stick together. For example, if a suspended mass contacts an adjacent actuation electrode, the mass may stick to the electrode. This phenomenon is known in the art as "stiction," which is a significant cause of yield loss and reliability failures in a wide variety of MEMS products. This problem can be particularly acute in the Z-direction when implementing a MEMS device with silicon-on-insulator (SOI) technology. Specifically, SOI wafers typically are very smooth to ensure that they maintain a secure bond between wafers. Such smoothness, however, enhances the probability of stiction with other layers of the device if the insulator layer under a suspended microstructure is removed.

SUMMARY OF THE INVENTION

In accordance with one embodiment of the invention, a method of producing a MEMS device provides a MEMS apparatus having released structure. The MEMS apparatus is formed at least in part from an SOI wafer having a first layer, a second layer spaced from the first layer, and an insulator layer between the first layer and second layer. The first layer has a top surface, while the second layer has a bottom surface facing the top surface. After providing the MEMS apparatus, the method increases the roughness of at least the top surface of the first layer or the bottom surface of the second layer.

Some embodiments increase the roughness of both the top surface of the first layer and the bottom surface of the second layer. Moreover, the second layer of the MEMS apparatus may have movable structure, and the insulator layer may be patterned to suspend that movable structure. Various materials may be used for one or both of the layers, such as single crystal silicon. The roughness illustratively should be increased to a sufficient number, such as to a value of greater than or equal to about 1.0 nm RMS.

A number of methods may be used to increase the roughness, such as by applying a dry etch or a wet etch to the MEMS apparatus. Moreover, by providing the MEMS apparatus, the method may etch the second layer to form unreleased structure, and remove at least a portion of the insulator layer to release the structure. In various embodiments, the top surface and bottom surface each have exposed areas that are not in contact with the insulator layer. The method thus may increase the roughness of at least a portion of the exposed area of the top surface of the first layer, or a portion of the exposed area of the bottom surface of the second layer.

The MEMS device may be implemented to perform a number of functions. For example, the MEMS device may be implemented as an inertial sensor (e.g., a gyroscope or accelerometer) or a microphone.

In accordance with another embodiment of the invention, another method of producing a MEMS device provides a first silicon wafer having a top surface, and bonds a second silicon wafer to the first silicon wafer by means of an insulator layer. The second silicon wafer has a bottom surface that faces the top surface of the first silicon wafer. The method then micromachines the second silicon wafer to form unreleased structure, and removes at least a portion of the insulator layer to release the structure. Finally, the method ensures that at least one of the bottom surface or the top surface has a roughness equal to or greater than about 1.0 nm RMS (nanometers root mean squared). The MEMS device, when in use, has the first silicon wafer and the second silicon wafer.

There are a number of ways to ensure that the relevant surface has a roughness equal to or greater than about 1.0 nm RMS. For example, the method may increase the roughness of at least one of the bottom surface and the top surface. As another example, the method may smooth at least one of the bottom surface and the top surface prior to bonding. The method then controls smoothing so that at least one of the bottom surface and the top surface has a roughness that is equal to or greater than about 1.0 nm RMS after the insulator layer is removed.

In accordance with another embodiments of the invention, a MEMS device has an SOI wafer having a first wafer with a top surface, a second wafer, and an insulator layer between the first wafer and the second wafer. The MEMS device also has structure formed by the second wafer, having a bottom surface, and spaced from the first wafer. At least one of the top surface or the bottom surface has a roughness that is equal to or greater than about 1.0 nm RMS.

BRIEF DESCRIPTION OF THE DRAWINGS

The foregoing advantages of the invention will be appreciated more fully from the following further description thereof with reference to the accompanying drawings wherein.

DESCRIPTION OF ILLUSTRATIVE EMBODIMENTS

Illustrative embodiments form a MEMS device that is less susceptible to stiction than many conventional, prior art designs. To accomplish this result, illustrative embodiments ensure that one or more specific surfaces of a silicon-on-insulator-based MEMS device has a roughness that is equal to or greater than some prespecified value. This value may be determined based upon the type of device and its application. For example, a low-G accelerometer, which has relatively loose springs, may be formed so that specified surfaces are rougher than corresponding surfaces on a high-G accelerometer, which has relatively firm springs. Details of various embodiments are discussed below.

Figure 1:
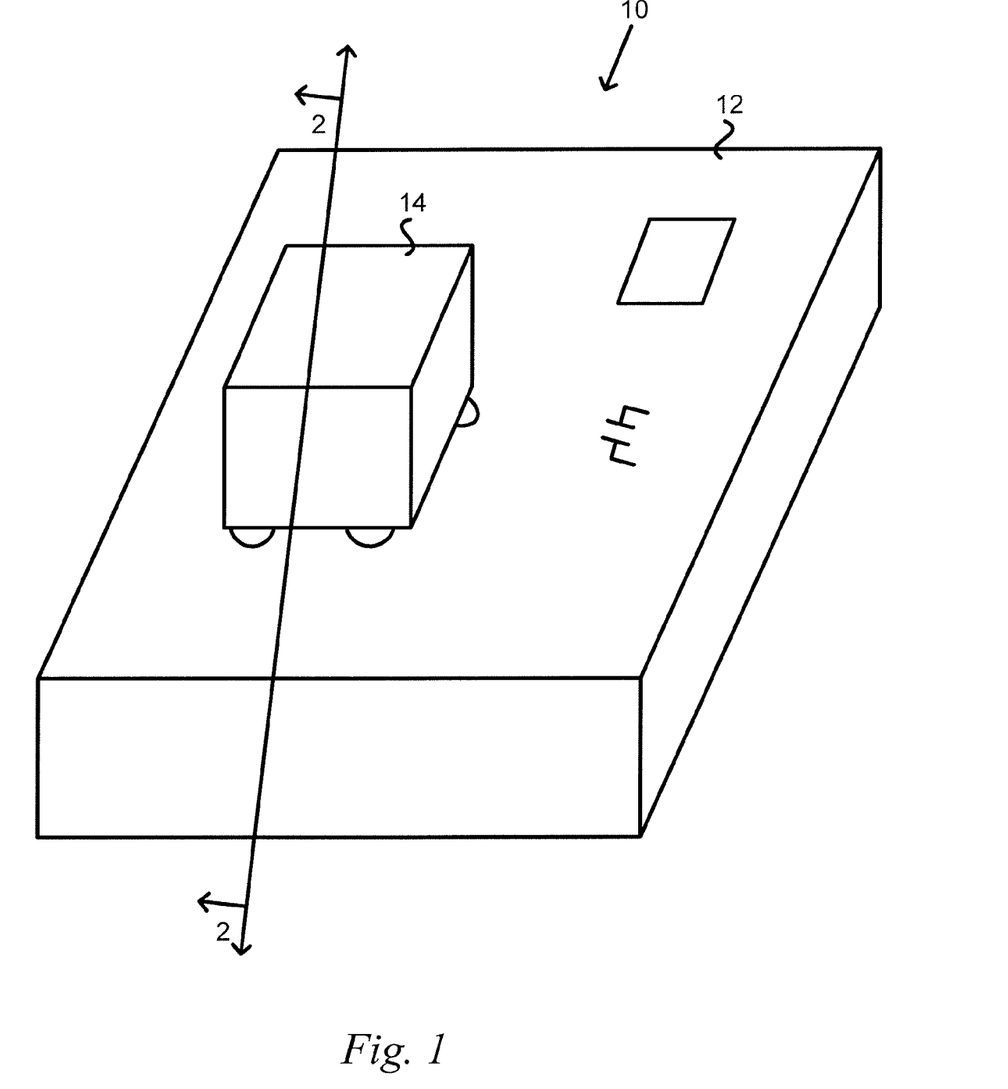
FIG. 1 schematically shows a system using a MEMS device that may be fabricated in accordance with illustrative embodiments of the invention.

FIG. 1 schematically shows a perspective view of a system 10 using a MEMS device 14 configured in accordance with illustrative embodiments of the invention. The system 10 may be any conventional electronic system that can benefit from use of MEMS devices. For example, the system 10 may be part of an air bag deployment system within an automobile, or part of microphone system within a cellular telephone.

The system 10 has a circuit board 12 supporting and selectively interconnecting a plurality of different electronic components. Among other things, the components can include analog circuits, digital circuits, integrated circuits, and discrete components. As shown, one of the integrated circuits is a MEMS device 14 configured in accordance with illustrative embodiments of invention.

The MEMS device 14 shown in FIG. 1 illustratively is a capped, flip-chip MEMS device configured to perform a specific function. Among other things, the MEMS device 14 may be an accelerometer for detecting linear acceleration, or a gyroscope for detecting angular rotation. Exemplary MEMS accelerometers are discussed in greater detail in U.S. Pat. No. 5,939,633, which is assigned to Analog Devices, Inc. of Norwood, Mass. Exemplary MEMS gyroscopes are discussed in greater detail in U.S. Pat. No. 6,505,511, which also is assigned to Analog Devices, Inc. of Norwood, Mass. The disclosures of U.S. Pat. Nos. 5,939,633 and 6,505,511 are incorporated herein, in their entireties, by reference.

It should be noted that other types of MEMS devices may be used. For example, a MEMS device may implement other functionality, such as that of a microphone or pressure sensor. In a similar manner, a conventional package may contain and protect the MEMS device 14, which may be in a flip-chip or non-flip chip configuration. Accordingly, discussion of the type of MEMS device 14 and specific packaging is illustrative and not intended to limit various embodiments of the invention.

Figure 2:
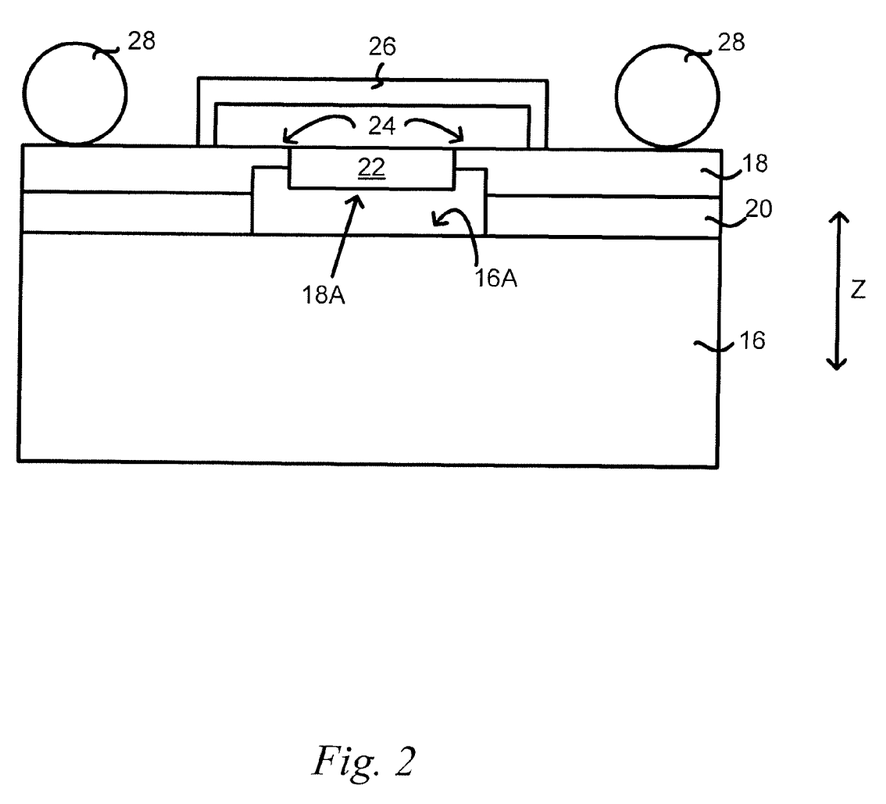
FIG. 2 schematically shows a cross-sectional view of the MEMS device shown in FIG. 1.

FIG. 2 schematically shows a cross-sectional view of the MEMS device 14 shown in FIG. 1 across section line 2-2. In illustrative embodiments, the MEMS device 14 is formed from a silicon-on-insulator wafer, commonly referred to as "an SOI" wafer. It should be noted that the terms "wafer" and "die" may be used to mean substantially the same thing and used interchangeably, although a wafer may form a plurality of individual dies.

As known by those skilled in the art, an SOI wafer commonly is formed by polishing two single crystal silicon wafers to attain flat front surfaces with a very low root mean square (RMS) surface roughness, such as 0.4 nanometers (nm). If the two mating surfaces are not very smooth or flat, then the resulting SOI wafers may have voids and/or weak bonds.

After they are polished and made flatter, the facing surfaces are oxidized. For example, conventional processes may form a 1 micron thick thermal oxide on one wafer. Accordingly, these clean, flat, and smooth wafers are placed in contact at room temperature to spontaneously bond together. This results in a structure comprising a pair of wafers bonded together and separated by an oxide layer (often referred to as a "buried oxide"). After a high temperature anneal, the exterior surfaces of one or both of the wafers of the bonded pair then may be ground and polished. For example, the wafer that ultimately will form much of the resulting structure may be ground and polished to a thickness of 10 microns. The other wafer thus may be ground to another thickness (e.g., 100 microns) that may be set by a number of factors, such as the requirements of the automated wafer handling equipment.

Of course, the MEMS device 14 shown in FIG. 2 has been fully processed from an SOI wafer to form a complete MEMS device. The three layers of the SOI wafer can still be seen in the final MEMS device 14; namely, the MEMS device 14 has a bottom silicon layer (referred to herein as the "substrate layer 16"), a top silicon layer (referred to herein as the "device layer 18"), and a buried oxide ("insulator layer 20") between the two silicon layers. The MEMS device 14 also has a movable mass 22 suspended above the substrate layer by a plurality of springs 24.

As shown, the device layer 18 forms the movable mass 22 and springs 24. In addition, the MEMS device 14 also has a cap 26 to protect the mass 22 and other microstructures on the device layer 18. Among other things, the cap 26 may be formed from deposited polysilicon or similar material. Solder balls 28 on the top surface of the device layer 18 enable the MEMS device 14 to physically and electrically connect with the circuit board 12.

It again should be reiterated that discussion of specific components of the MEMS device 14 are illustrative and thus, not intended to limit various aspects of invention. Accordingly, other structures and designs may be used. For example, the MEMS device 14 also may have CMOS circuitry for performing a number of functions, such as detecting changing capacitance between interdigitated sensing fingers (see above incorporated patents for details regarding interdigitated fingers). Various embodiments of the invention therefore apply to MEMS devices with or without circuitry integrated on the same wafer/die. The devices shown in FIGS. 1 and 2 therefore are schematic and used simply to discuss various embodiments of the invention.

To mitigate stiction problems between the device and substrate layers 18 and 16 (i.e., in the Z-direction), illustrative embodiments roughen 1) the bottom surface 18A of device layer 18, 2) the top surface 16A of the substrate layer 16, or 3) both of the noted facing surfaces 16A and 18A. Some embodiments, however, roughen selected portions of those surfaces only. In illustrative embodiments, such surfaces 16A and 18A are roughened to a value of greater than or equal to about 1.0 nm RMS. It should be noted that general mention of "roughening a surface" includes roughening the entire surface, or only a portion of the surface.

FIGS. 3A-3H show a number of different roughening configurations that may be used in accordance with various embodiments of the invention. Each of these configurations, however, is intended to be an example only. Accordingly, one of ordinary skill in the art may modify these configurations to fit the requirements of a specific process or application.

Each of FIGS. 3A-3H show an exploded view of the three layers of the MEMS device 14 in a manner that exposes their corresponding surfaces 16A and 16B. Specifically, with reference to FIG. 3A, each of the figures shows the bottom surface 18A of the device layer 18, the top surface 16A of the substrate layer 16, and some surface of the insulator layer 20. To more clearly show the location of the structure 22, 24, the portion of the insulator layer 20 between the structure 22, 24 and the substrate layer 16 has been removed. The structure 22, 24, however, is not explicitly shown in the device layer 18 of these figures. Instead, the area on the device layer 18 corresponding to the remove oxide should be considered to include the structure 22, 24.

Figure 3A:
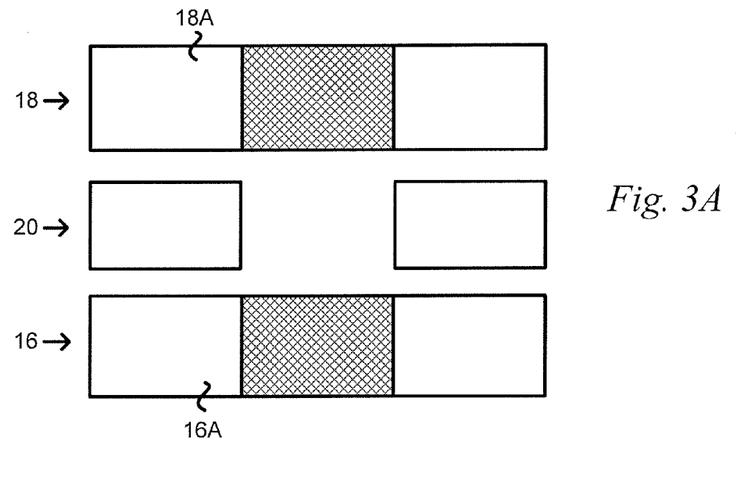
FIG. 3A schematically shows an embodiment in which a portion of the bottom surface of the device layer and a corresponding portion of top surface of the substrate layer are both roughened.
Figure 3B:
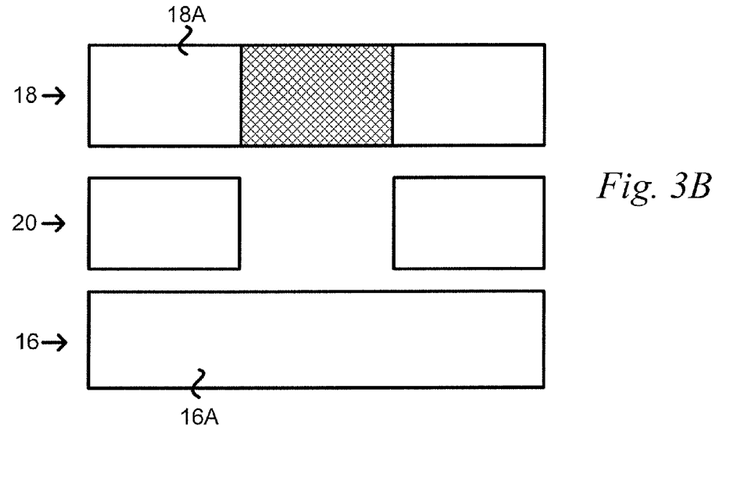
FIG. 3B schematically shows an embodiment in which only a portion of the bottom surface of the device layer is roughened.
Figure 3C:
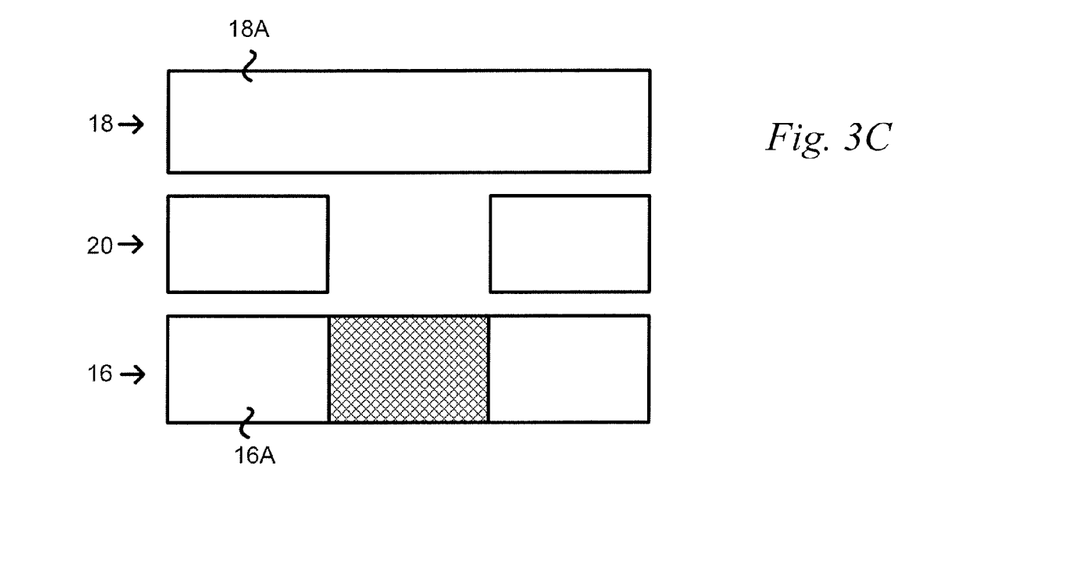
FIG. 3C schematically shows an embodiment in which only a portion of the top surface of the substrate layer is roughened.

As noted above, various embodiments may roughen one or both of the different surfaces 16A and 18A. FIGS. 3A to 3C, for example, simply roughen selected portions of one or more the surfaces 16A and 18A. The other surface portions therefore are smoother than the roughened portions. Specifically, the embodiment in FIG. 3A roughens the bottom surface 18A of the structure 22, 24 of the device layer 18, and the corresponding top surface 16A of the substrate layer 16. This embodiment, however, does not roughen the remaining portions of the two facing surfaces 16A and 18A. Such embodiment should provide improved stiction performance while ensuring the viability of the bond between the device layer 18 and substrate layer 16.

The embodiment in FIG. 3B, however, roughens the bottom surface 18A of the structure 22, 24 in the device layer 18 only. In a similar manner, the embodiment in FIG. 3C only roughens the top surface 16A of the substrate layer 16 corresponding to the area of the structure 22, 24 in the device layer 18. Both embodiments shown in FIGS. 3B and 3C therefore roughen only a portion of one surface of one layer.

Figure 3D:
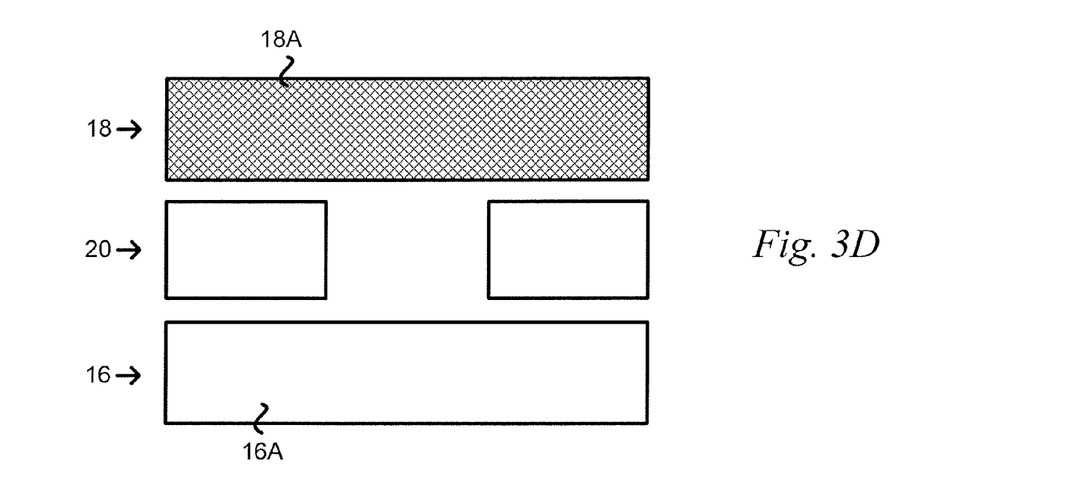
FIG. 3D schematically shows an embodiment in which the entire bottom surface of the device layer is roughened.
Figure 3E:
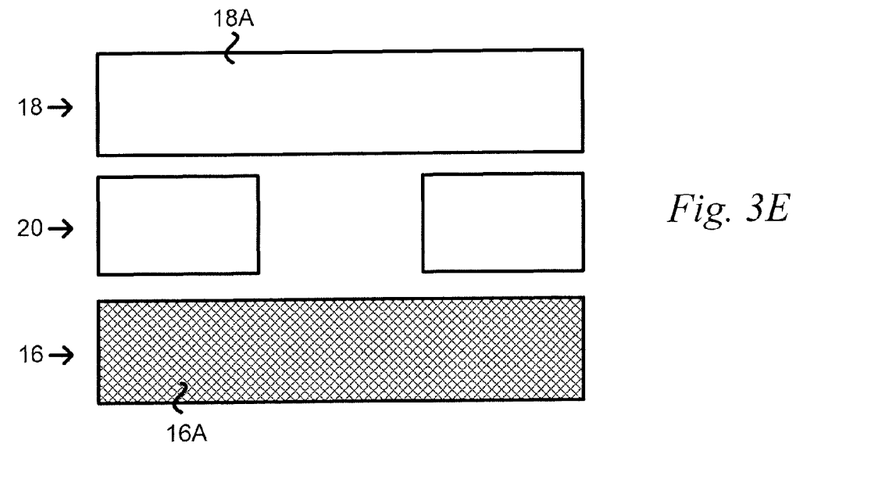
FIG. 3E schematically shows an embodiment in which the entire top surface of the substrate layer is roughened.
Figure 3F:
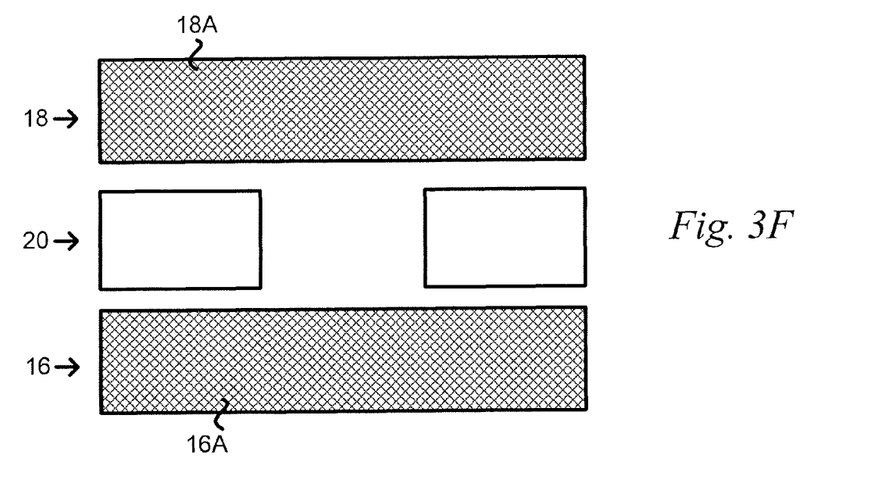
FIG. 3F schematically shows an embodiment in which the entire top surface of a substrate layer, and entire bottom surface of the device layer are roughened.

FIGS. 3D to 3F roughen the entirety of the surfaces 16A and 18A of one or both of the device and substrate layers 18 and 16. Specifically, the bottom surface 18A of the device layer 18 shown in FIG. 3D is entirely roughened while, conversely, the top surface 16A of the substrate layer 16 shown in FIG. 3E is entirely roughened. FIG. 3F shows an embodiment in which both surfaces 16A and 16B are entirely roughened.

Figure 3G:
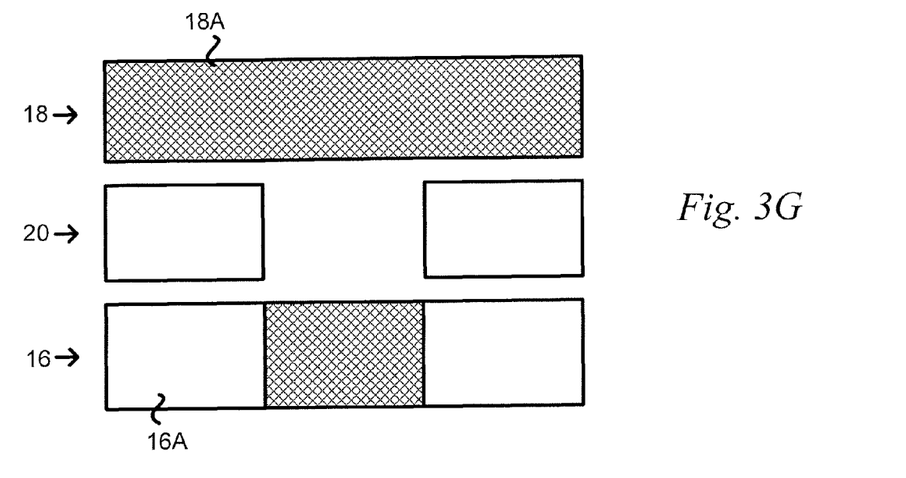
FIG. 3G schematically shows an embodiment in which a portion of the top surface of the substrate layer and entire bottom surface of the device layer are both roughened.
Figure 3H:
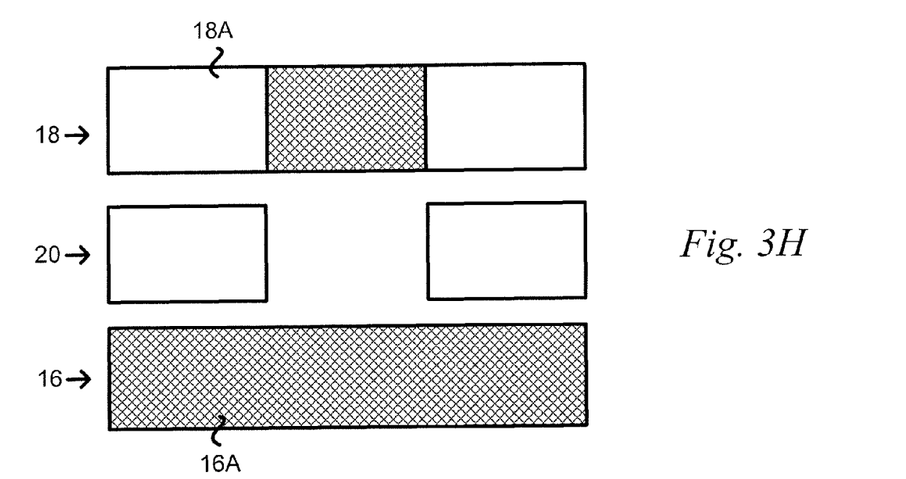
FIG. 3H schematically shows an embodiment in which the entire top surface of the substrate layer and a portion of the bottom surface of the device layer are both roughened.

FIGS. 3G and 3H combine the embodiments of FIGS. 3A-3F. For example, the entire bottom surface 18A of the device layer 18 in FIG. 3G is roughened, while only a portion of the top surface 16A of the substrate layer 16 is roughened. Conversely, in FIG. 3H, only a portion of the bottom surface 18A device layer 18 is roughened, while the entire top surface 16A of the substrate layer 16 is roughened.

These roughened surfaces illustrate a number of options designers may use when developing SOI-based MEMS devices. Those skilled in the art should be capable of modifying these options, or using different roughening options when developing SOI-based MEMS devices. For example, a designer may roughen only a portion of the exposed bottom surface 18A of the structure 22, 24.

Figure 4:
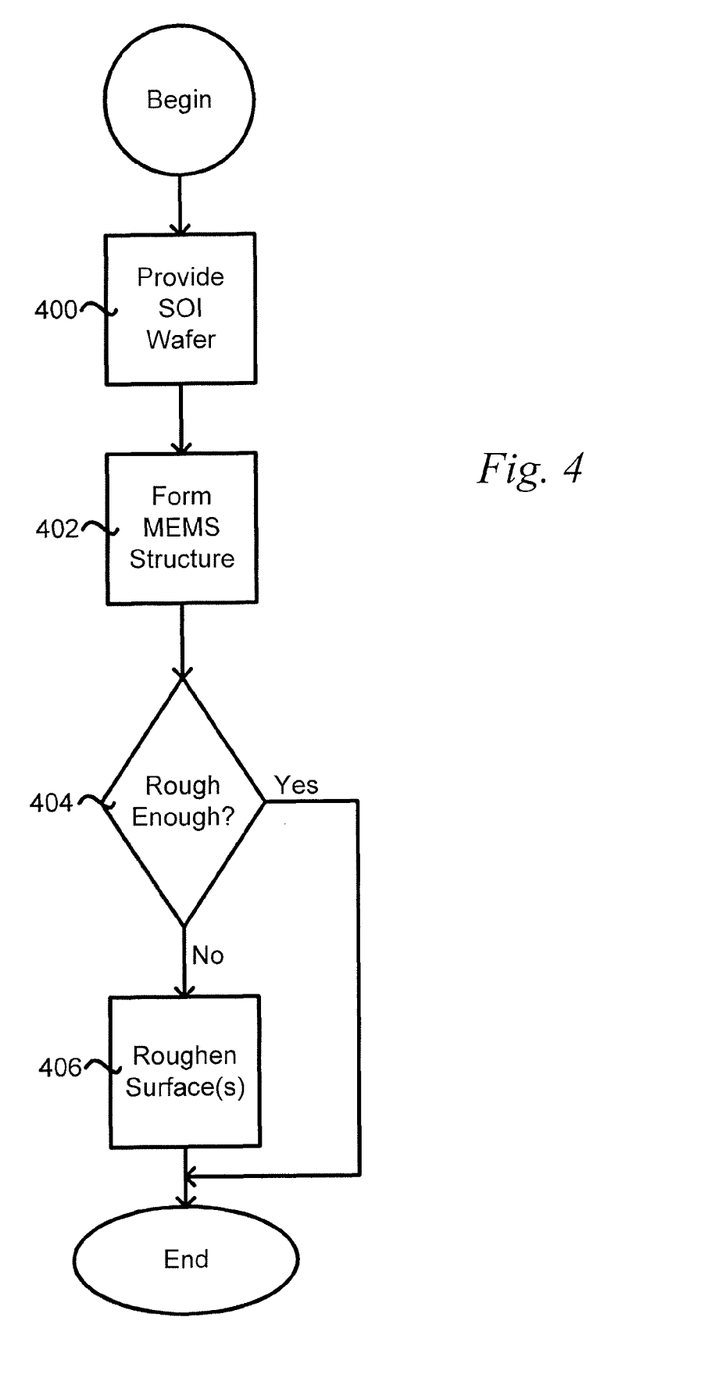
FIG. 4 shows a process of forming the MEMS device of FIGS. 1 and 2 in accordance with illustrative embodiments of the invention.

FIG. 4 shows a process of fabricating the MEMS device 14 of FIGS. 1 and 2 in accordance with illustrative embodiments of the invention. The process begins at step 400, which provides an SOI wafer for processing. The process then forms MEMS structure 22, 24 in accordance with conventional processes (step 402). For example, conventional micromachining processes first may pattern/etch the device layer 18, and then remove selected portions of the insulator layer 20 to suspend the MEMS structure 22, 24 above the substrate layer 16 (also known as "releasing" the structure 22, 24).

It then is determined at step 404 if one or both of the above noted facing surfaces 16A and 18A has a roughness that is sufficient to mitigate stiction in accordance with illustrative embodiments of the invention. If the roughness is unknown at this point, conventional tests may be used to determine its roughness. It is anticipated, however, that those skilled in the art already know the roughness of the surfaces 16A and 18A at this point, and make this determination based upon this known roughness.

Specifically, as noted above, the SOI wafer is formed by polishing two single crystal silicon wafers to attain flat front surfaces with a very low RMS surface roughness, such as 0.4 nanometers. The smoothness of the surfaces may be made even greater during the oxidation process. Accordingly, the process ends if the desired surface(s) is/are rough enough. If not rough enough, the process continues to step 406, which roughens one or both of the surfaces 16A, 18A as discussed above.

These surfaces 16A and 18A may be roughened in a number of ways. For example, the surfaces may be roughened after the MEMS structure 22, 24 is formed and released. To that end, among other ways, conventional processes may apply a dry etch to the surfaces using an etchant that attacks silicon. Xenon difluoride may be one such etchant.

Wet etching also can be used during this step. To avoid stiction when the final rinse liquid is dried, however, the wet etch process may use a removable pedestal (e.g., formed from a photoresist material) to support the structure 22, 24 while applying the wet etch. The pedestal then may be removed after the roughening process is complete. See, for example, Provisional U.S. Patent Application No. 60/754,984, filed Dec. 29, 2005, entitled, "Process of Forming Microphone Using Support Member," and naming Jason Weigold as the inventor, for additional information relating to micromachining processes using a removable pedestal. The disclosure of that application is incorporated herein, in its entirety, by reference. Supercritical and sublimination drying processes also may be used.

As another example, however, the surfaces may be roughened by simply not polishing specific surfaces during SOI wafer fabrication processes. Accordingly, at least some portions of either of the noted surfaces 16A and 18A may not be polished as much as it/they is/are normally polished during the SOI wafer fabrication process. For example, during the SOI wafer fabrication process, the bottom surface of the wafer ultimately forming the device layer 18 may be polished to a roughness of no less than 1 nanometer. Accordingly, this approach may avoid the step of affirmatively roughening one or more of the surfaces.

It should be noted that the process of FIG. 4 provides only the basic steps of one process for forming a MEMS device in accordance of illustrative embodiments of the invention. For example, testing and dicing steps are not discussed. Those skilled in the art nevertheless should understand that additional steps should be taken to form a viable MEMS device.

Accordingly, MEMS devices formed using illustrative processes described above should have properties that mitigate the likelihood of stiction in the Z-direction (i.e., between the bottom surface 18A of the MEMS structure 22, 24 and the top surface 16A of the substrate layer 16).

Although the above discussion discloses various exemplary embodiments of the invention, it should be apparent that those skilled in the art can make various modifications that will achieve some of the advantages of the invention without departing from the true scope of the invention.

What is claimed is:

1. A method of producing a MEMS device, the method comprising:
   providing a MEMS apparatus having released structure, the MEMS apparatus being formed at least in part from an SOI wafer having a first layer, a second layer spaced from the first layer, and an insulator layer between the first layer and second layer, the first layer having a top surface, the second layer having a bottom surface facing the top surface of the first layer; and
   after providing the MEMS apparatus, increasing the roughness of at least the top surface of the first layer or the bottom surface of the second layer, the method increasing the roughness by applying a dry etch or a wet etch to at least one of the top surface of the first layer or the bottom surface of the second layer.

2. The method as defined by claim 1 wherein increasing the roughness comprises increasing the roughness of both the top surface of the first layer and the bottom surface of the second layer.

3. The method as defined by claim 1 wherein the second layer of the MEMS apparatus comprises movable structure, the insulator layer being patterned to suspend the movable structure.

4. The method as defined by claim 1 wherein the first layer and second layer each are formed from single crystal silicon.

5. The method as defined by claim 1 wherein increasing the roughness comprises increasing the roughness of at least the top surface of the first layer or the bottom surface of the second layer to a value of greater than or equal to about 1.0 nm RMS.

6. The method as defined by claim 1 wherein providing comprises:
   etching the second layer to form unreleased structure; and
   removing at least a portion of the insulator layer to release the structure.

7. The method as defined by claim 1 wherein the top surface and bottom surface each have exposed areas that are not in contact with the insulator layer, increasing the roughness comprising increasing the roughness of at least a portion of the exposed area of the top surface of the first layer or a portion of the exposed area of the bottom surface of the second layer.

8. The method as defined by claim 1 wherein the MEMS device is an inertial sensor or a microphone.

9. A MEMS device comprising:
   an SOI wafer having a first wafer with a top surface, a second wafer, and an insulator layer between the first wafer and the second wafer; and
   structure formed by the second wafer and having a bottom surface, the structure being spaced from the first wafer,
   at least a portion of either one of the top surface or the bottom surface having a minimum roughness of at least 1.0 nm RMS.

10. The MEMS device as defined by claim 9 wherein both the top surface and the bottom surface have a roughness that is equal to or greater than about 1.0 nm RMS.

11. The MEMS device as defined by claim 9 wherein the first wafer and second wafer each comprise silicon.

12. The MEMS device as defined by claim 9 wherein the structure has a structure surface that comprises a part of the bottom surface of the second wafer, the structure surface having a roughness that is equal to or greater than about 1.0 nm RMS.

* * * * *